(12) United States Patent
Asahina

(10) Patent No.: US 6,496,134 B1
(45) Date of Patent: Dec. 17, 2002

(54) FREQUENCY SPECTRUM METHOD AND FREQUENCY SPECTRUM ANALYZER

(75) Inventor: Yoshimitsu Asahina, Tokyo (JP)

(73) Assignee: Ando Electric Co., Ltd., Kanagawa (JP)

( * ) Notice: Subject to any disclaimer, the term of this patent is extended or adjusted under 35 U.S.C. 154(b) by 0 days.

(21) Appl. No.: 09/665,403

(22) Filed: Sep. 20, 2000

(30) Foreign Application Priority Data

Sep. 28, 1999 (JP) .......................................... 11-274453

(51) Int. Cl.[7] .......................... H03M 1/12; H03K 5/159
(52) U.S. Cl. ....................................... 341/155; 375/235
(58) Field of Search .............................. 341/155, 118, 341/139; 375/235; 702/77

(56) References Cited

U.S. PATENT DOCUMENTS 4,843,390 A * 6/1989 Van Bavel et al. ......... 341/139
5,706,202 A * 1/1998 Itahara et al. ................ 702/77
5,841,811 A * 11/1998 Song ........................... 375/235
6,016,112 A * 1/2000 Knudsen ..................... 341/118

* cited by examiner

Primary Examiner—Peguy JeanPierre
Assistant Examiner—Jean Bruner JeanGlaude
(74) Attorney, Agent, or Firm—Fish & Richardson P.C.

(57) ABSTRACT

The problem is solved by converting each radio frequency of a plurality of communications systems to tested signals as digital signals via single A/D conversion means; inputting the one A/D-converted tested signal to Fourier transform means 16 for frequency spectrum analysis; converting the other A/D-converted tested signal and a local frequency LO2 via a tested signal converter 13; filtering the converted tested signals S13 to convert them to tested signals S14 containing necessary signal components; and decimating the filtered tested signals S14 and performing frequency spectrum analysis on the decimated tested signals S15 via the Fourier transform means 16.

7 Claims, 4 Drawing Sheets

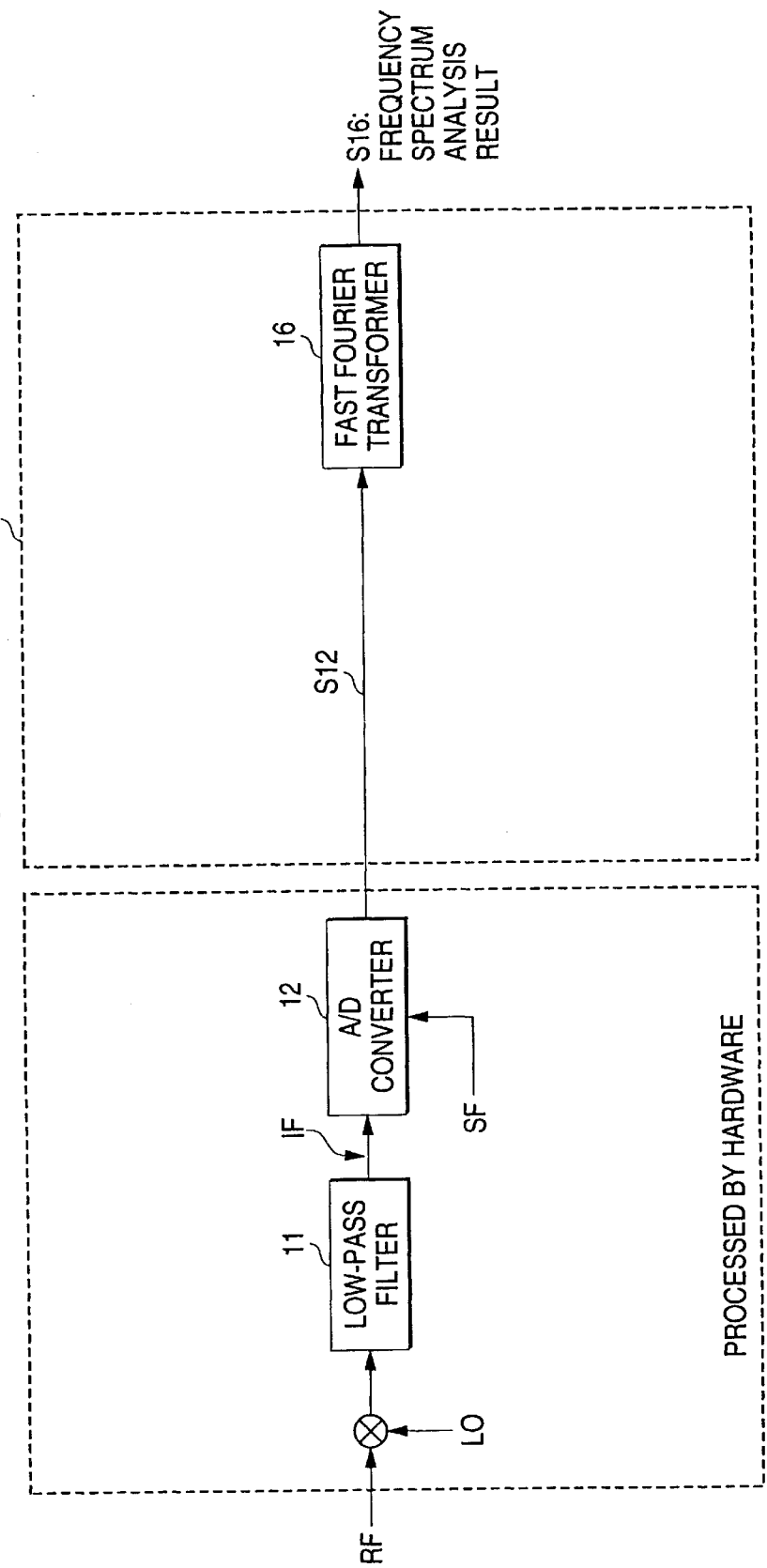

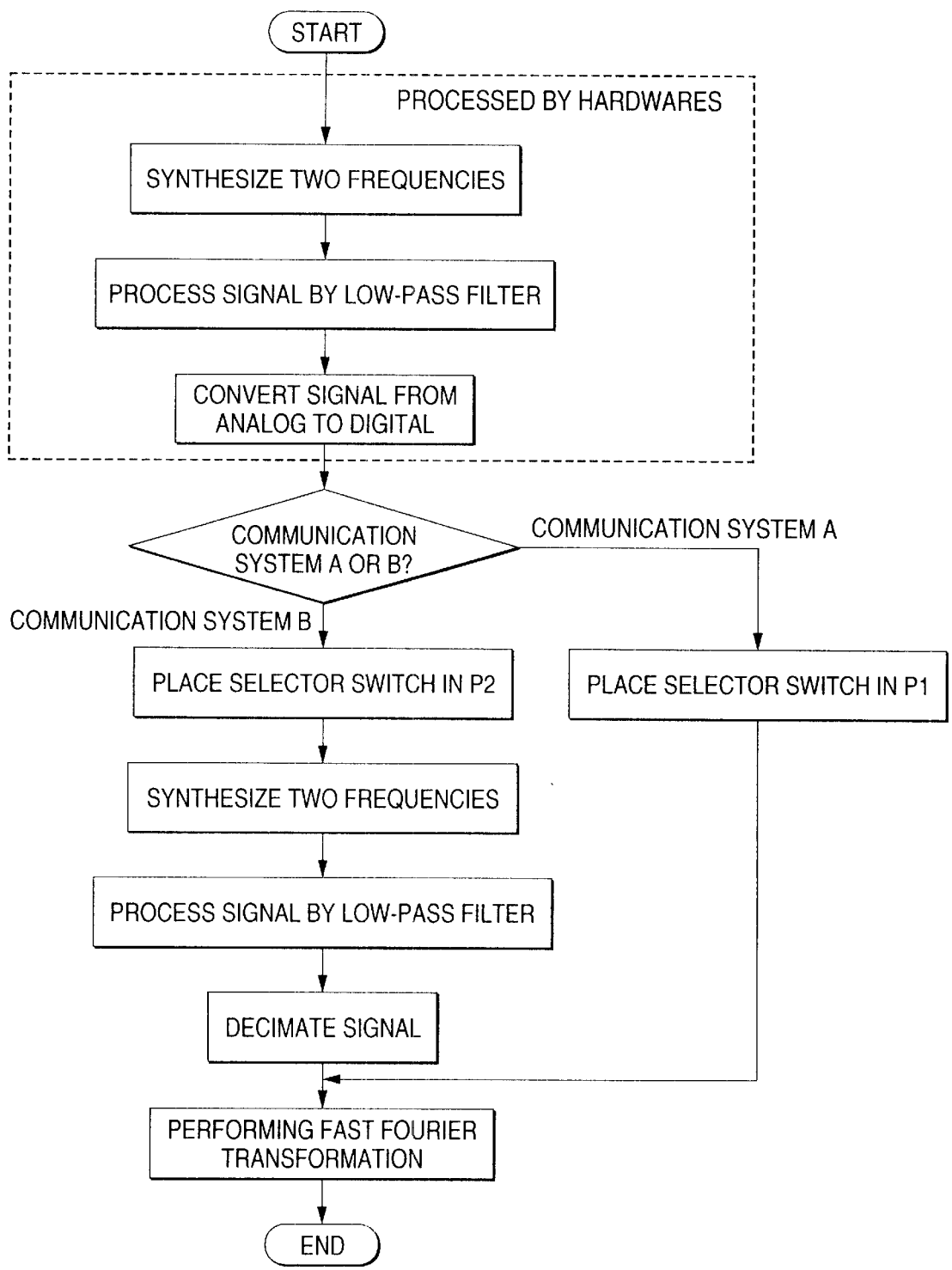

FREQUENCY SPECTRUM METHOD AND FREQUENCY SPECTRUM ANALYZER

BACKGROUND OF THE INVENTION

1. Field of the Invention

The present invention relates to a frequency spectrum analysis method and a frequency spectrum analyzer, and in particular to a frequency spectrum analysis method and a frequency spectrum analyzer in which frequency spectrum analysis is performed via software by using proper tested signals on a per communications system basis.

2. Description of the Related Art

FIG. 2 is a block diagram showing a conventional frequency spectrum analyzer. Two types of communications systems, Communications System A and Communications System B, are treated in this figure.

For Communications System A, tested signals S12A are input to a fast Fourier transformer 16. For Communications System B, tested signals S12B are input to the fast Fourier transformer 16.

Intermediate frequencies IFA, IFB and sampling frequencies SFA, SFB of Communications System A and Communications System B differ from each other; for example, the intermediate frequency IFA of Communications System A is 3.6 MHz and the sampling frequency SFA is 14.4 MHz while the intermediate frequency IFB of Communications System B is 100 kHz and the sampling frequency SFB is 400 kHz.

Communications System A and Communications System B use frequency spectrum resolutions different from each other to perform frequency spectrum analysis.

For example, the frequency spectrum resolution required of Communications System A is approximately 1800 Hz and the frequency spectrum resolution required of Communications System B is approximately 50 Hz. Sampling data count required by the fast Fourier transformer 16 is 8192 ($2^{13}$) for both Communications System A and Communications System B.

Communications System A: 14.4 MHz÷8192= 1757.8≈1760 Hz

Communications System B: 400 kHz÷8192=48.8≈50 Hz

The following describes a processing procedure to take when Communications System A or Communications System B is selected for frequency spectrum analysis.

In the case of frequency spectrum analysis in Communications System A, system selector switches SW2, SW3 are placed in the P1 position and an output frequency obtained through frequency synthesis of a radio frequency RF and a local frequency LO1A is input to a low-pass filter 11A composed of hardware and converted to an intermediate frequency IFA. The intermediate frequency IFA is input to an A/D converter 12A to obtain tested signals S12A as digital signals. The tested signals S12A are input to the fast Fourier transformer 16 to obtain frequency spectrum analysis results S16.

In the case of frequency spectrum analysis in Communications System B, system selector switches SW2, SW3 are placed in the P2 position and an output frequency obtained through frequency synthesis of a radio frequency RF and a local frequency LO1B is input to a low-pass filter 11B composed of hardware and converted to an intermediate frequency IFB. The intermediate frequency IFB is input to an A/D converter 12B to obtain tested signals S12B as digital signals. The tested signals S12B are input to the fast Fourier transformer 16 to obtain frequency spectrum analysis results S16.

The frequency spectrum analyzer has a problem that new hardware must be implemented for each communications system thus expanding the size of apparatus. In order to solve this problem, a configuration is proposed in which apparatus size is reduced by using the same hardware and realizing through software the difference in hardware design.

FIG. 3 is a block diagram showing a frequency spectrum analyzer with apparatus size reduced. Same as a conventional frequency spectrum analyzer, Two types of communications systems, Communications System A and Communications System B, are treated in this figure.

Apparatus size is reduced by sharing hardware between Communications System A and Communications System B. An intermediate frequency IF and a sampling frequency SF shall satisfy the test conditions of a conventional frequency spectrum analyzer and the IF and the SF shall be the higher of the IF frequencies and SF frequencies of Communications System A and Communications System B, respectively.

For both Communications System A and Communications System B, tested signals S12 are input to the fast Fourier transformer 16. Required frequency spectrum analysis resolution is obtained by changing the sampling data count at fast Fourier transform depending on the communications system employed.

Thus the intermediate frequency IF is 3.6 MHz and the sampling frequency SF is 14.4 MHz. Same as a conventional frequency spectrum analyzer, the frequency spectrum resolution required of Communications System A is approximately 1800 Hz and the frequency spectrum resolution required of Communications System B is approximately 50 Hz. Sampling data count required by the fast Fourier transformer 16 is 8192 ($2^{13}$) for Communications System A and 262144 ($2^{18}$) for Communications System B.

Communications System A: 14.4 MHz÷8192= 1757.8≈1760 Hz

Communications System B: 14.4 MHz÷262144=54.9≈55 Hz

The following describes a processing procedure to take when Communications System A or Communications System B is selected for frequency spectrum analysis.

In the case of frequency spectrum analysis in Communications System A, an output frequency obtained through frequency synthesis of a radio frequency RF and a local frequency LO is input to a low-pass filter 11 composed of hardware and converted to an intermediate frequency IF. The intermediate frequency IF is input to an A/D converter 12 to obtain tested signals S12 as digital signals. The tested signals S12 are input to the fast Fourier transformer 16 to obtain frequency spectrum analysis results S16.

The frequency spectrum analysis in Communications System B is the same as that in Communications System A. However, the sampling data count required by the fast Fourier transformer 16 is a huge 262144. This resents problems that the processing time is extremely long and memory used for operation such as fast Fourier transform is large.

A conventional frequency spectrum analyzer has a problem that the apparatus size is large and a frequency spectrum analyzer with apparatus size reduced has problems that memory usage is large and frequency spectrum analysis takes huge processing time.

For a frequency spectrum analyzer with apparatus size reduced, reduced sampling data count required by the fast Fourier transformer in Communications System B would shorten the processing time and reduce memory usage.

SUMMARY OF THE INVENTION

The object of the invention is to provide a frequency spectrum analyzer wherein apparatus size is reduced, processing time is shortened, and memory usage is reduced while the conventional frequency spectrum analysis performance is retained, by adding a signal processor in software which provides an intermediate frequency and a sampling frequency equivalent to those of a conventional frequency spectrum analyzer for each communications system, based on a frequency spectrum analyzer with apparatus size reduced.

The invention solves the aforementioned problems via the following frequency spectrum analysis methods and frequency spectrum analyzers:

1. A frequency spectrum method comprising the steps of:

converting each radio frequency of a plurality of communications systems to tested signals as digital signals via single A/D conversion means, inputting said one A/D-converted tested signal to Fourier transform means for frequency spectrum analysis, converting said other A/D-converted tested signal and a local frequency via a tested signal converter, filtering the converted tested signals to convert them to tested signals containing necessary signal components, and decimating the filtered tested signals and performing frequency spectrum analysis on the decimated tested signals via the Fourier transform means.

2. A frequency spectrum method comprising the steps of:

synthesizing each of the radio frequencies with local frequencies and filtering the frequency-synthesized tested signals to convert them to tested signals containing necessary signal components, and performing A/D conversion on the tested signals to obtain the digital signals.

3. A frequency spectrum analyzer for performing frequency spectrum analysis comprising:

a tested signal converter for inputting tested signals and outputting converted tested signals, a low-pass filter for inputting the converted tested signals and outputting filtered tested signals, a sampling frequency converter for inputting filtered tested signals and outputting tested signals, system selector switches for switching between communications systems, and a fast Fourier transformer for inputting tested signals and outputting frequency spectrum analysis results, characterized in that frequency spectrum is analyzed via software by using proper tested signals for each communications system.

4. A frequency spectrum analyzer, characterized in that the tested signal converter performs frequency synthesis of tested signals and local frequencies to convert the tested signals to the tested signals in a proper frequency band.

5. A frequency spectrum analyzer, characterized in that the system selector switches make switching so that one tested signal is input to the fast Fourier transformer and the other tested signal is converted by the tested signal converter, low-pass filter and sampling frequency converter, and the converted signal is input to the fast Fourier transformer.

6. A frequency spectrum analyzer for converting each of radio frequencies of communications systems having different frequencies to digital signals via a single A/D converter and performing frequency spectrum analysis on the digital signals via a frequency spectrum analysis section consisting of a single fast Fourier transformer, the frequency spectrum analysis section comprising:

a tested signal converter for inputting tested signals and outputting converted tested signals, a low-pass filter for inputting the converted tested signals and outputting filtered tested signals, a sampling frequency converter for inputting filtered tested signals and outputting tested signals, system selector switches for switching between communications systems, and a fast Fourier transformer for performing frequency spectrum analysis on the selectively input tested signals and outputting frequency spectrum results, characterized in that frequency spectrum is analyzed via software by using proper tested signals for each communications system.

7. A frequency spectrum analyzer, characterized in that the single A/D converter comprises:

a low-pass filter for converting to intermediate signals the frequency obtained by synthesizing each of the radio frequencies and a first local frequency and an A/D converter for A/D-converting the intermediate frequency.

8. A frequency spectrum analyzer, characterized in that the tested signal converter performs frequency synthesis of tested signals and a second local frequency to convert the tested signals to the tested signals in a proper frequency band.

9. A frequency spectrum analyzer, characterized in that the system selector switches make switching so that one digitally converted signal is input to the fast Fourier transformer and the other digitally converted signal is converted by the tested signal converter, low-pass filter and sampling frequency converter, and the converted signal is input to the fast Fourier transformer.

BRIEF DESCRIPTION OF THE DRAWINGS

FIG. 3 is a block diagram of a frequency spectrum analyzer with apparatus size reduced.

FIG. 4 is a flowchart in a frequency spectrum analyzer according to the invention.

BACKGROUND OF THE INVENTION

Figure 1:
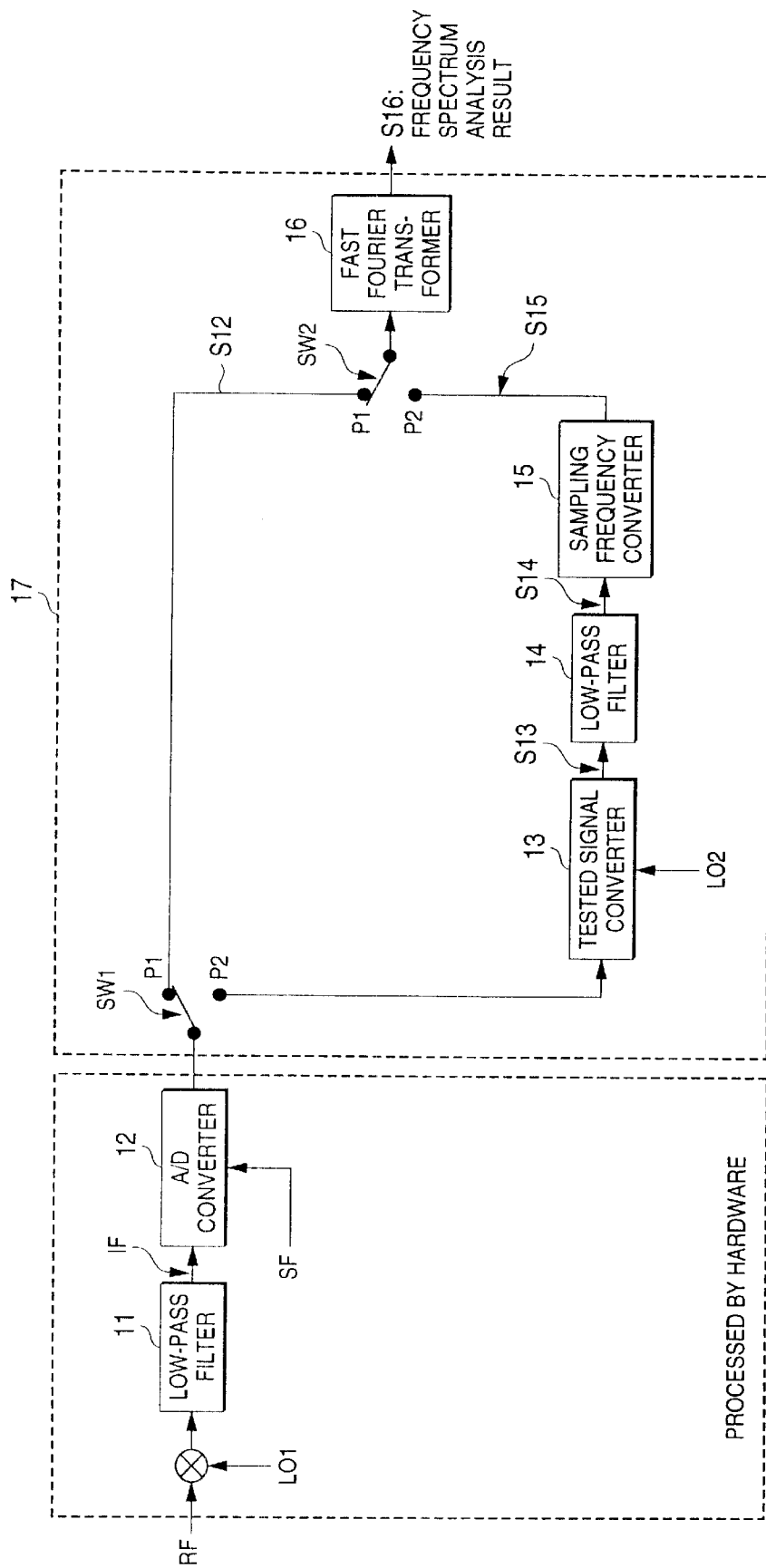
FIG. 1 is a block diagram of a frequency spectrum analyzer according to the invention.
Figure 2:
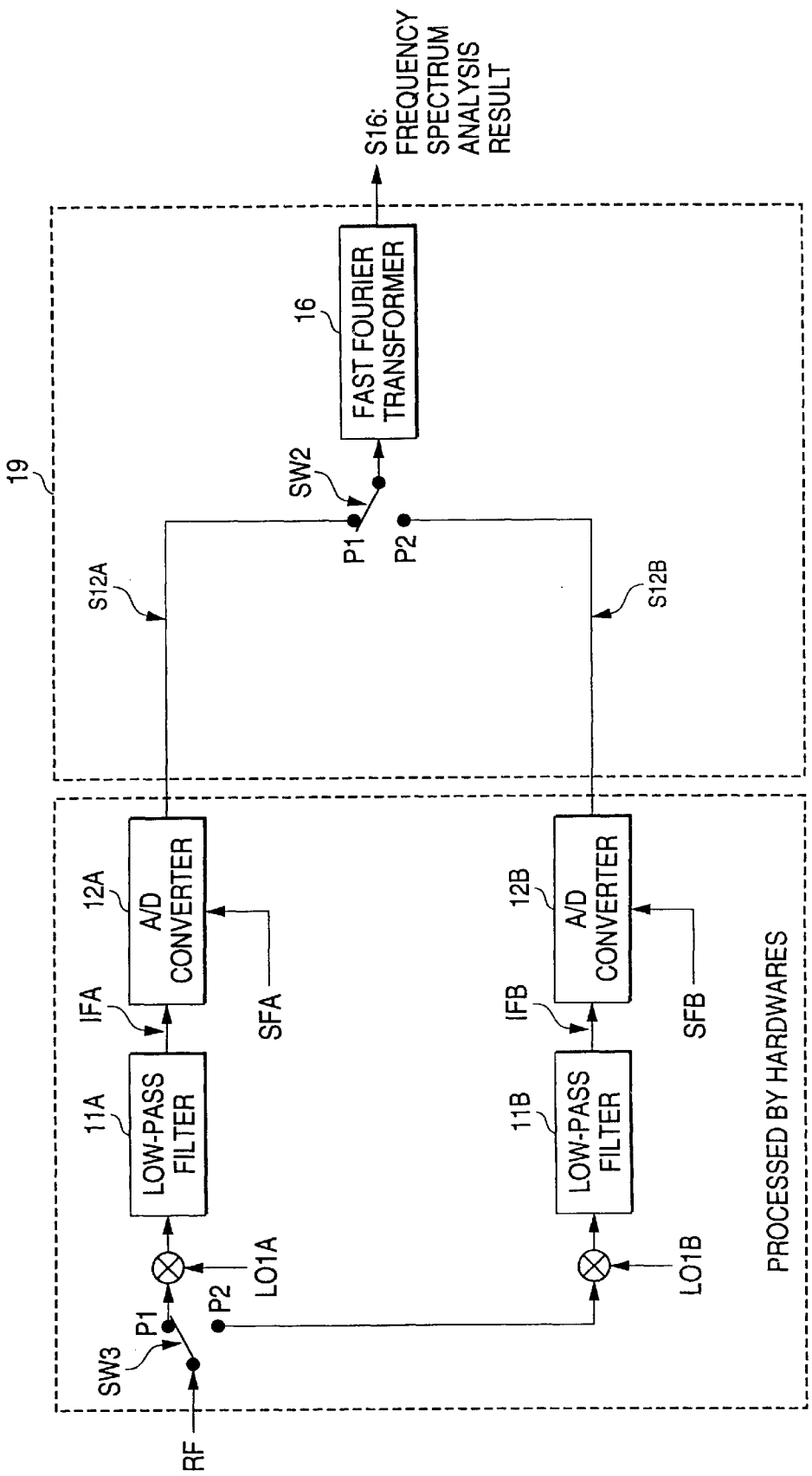
FIG. 2 is a block diagram of a conventional frequency spectrum analyzer.

FIG. 1 shows the configuration of a frequency spectrum analyzer according to the invention.

Same as a conventional frequency spectrum analyzer, two types of communications systems, Communications System A and Communications System B, are treated in this figure. For Communications System A, tested signals S12 are input to a fast Fourier transformer 16. For Communications System B, tested signals S15 are input to the fast Fourier transformer 16.

Communications System A has the same configuration as that of a frequency spectrum analyzer with apparatus size reduced. For Communications System B, system selector switches SW1, SW2, a tested signal converter 13, a low-pass filter 14 and a sampling frequency converter 15 are added in the frequency spectrum analyzer with apparatus size reduced via software, so that the same test conditions as those for a conventional frequency spectrum analyzer can be satisfied.

The intermediate frequency IF A is 3.6 MHz and the sampling frequency SFA is 14.4 MHz, same as those of a frequency spectrum analyzer with apparatus size reduced. Frequency spectrum resolution required of Communications System A is approximately 1800 Hz and the frequency spectrum resolution required of Communications System B is approximately 50 Hz, same as a conventional frequency spectrum analyzer.

In order to obtain the frequency spectrum resolution, sampling data count required by the fast Fourier transformer 16 is 8192 (2^13) for both Communications System A and Communications System B, same as a conventional frequency spectrum analyzer.

Communications System A: 14.4 MHz÷8192= 1757.8≈1760 Hz

Communications System B: 400 kHz÷8192=48.8≈50 Hz

The following describes a processing procedure to take when Communications System A or Communications System B is selected for frequency spectrum analysis, with reference to FIG. 1 and FIG. 4.

For both Communications System A and Communications System B, an output frequency obtained through frequency synthesis of a radio frequency RF and a local frequency LO1 is input to a low-pass filter 11 composed of hardware and converted to an intermediate frequency IF. The intermediate frequency IF is input to an A/D converter 12 to obtain tested signals S12 as digital signals.

In the case of frequency spectrum analysis in Communications System A, system selector switches SW2, SW3 are placed in the P1 position and tested signals S12 are input to the fast Fourier transformer 16 to obtain frequency spectrum analysis results S16.

In the case of frequency spectrum analysis in Communications System B, system selector switches SW2, SW3 are placed in the P2 position and frequency synthesis is performed on tested signals S12 and a local frequency LO2 via a tested signal converter 13 to convert the tested signals to the tested signals in a proper frequency band. The converted tested signals S13 is input to a low-pass filter to obtain tested signals containing necessary signal components.

The low-pass filter 14 has a characteristic to retain low frequencies containing difference frequency components and filter out sum frequency, both frequencies being generated via frequency synthesis by the tested signal converter 13, and a filter characteristics for decimation by a subsequent sampling frequency converter 15. The decimation is an operation for converting a discrete time signal sampled for a period of time to another discrete time signal having a sampling period longer than that of the discrete time signal.

Filtered tested signals S14 are input to the sampling frequency converter 15 for decimation and tested signals S15 is obtained as an output. The tested signals S15 are input to a fast Fourier transformer 16 to obtain frequency spectrum results S16.

The following describes the specific process for obtaining a frequency spectrum resolution equivalent to that of a conventional frequency spectrum analyzer.

For Communications System A, the intermediate frequency IF is 3.6 MHz and the sampling frequency SF is 14.4 MHz. Thus the frequency spectrum resolution of Communications System A is 14.4 MHz÷8192=1757.8≈1760 Hz, equivalent to that of a conventional frequency spectrum analyzer.

For Communications System B, the intermediate frequency IF is 3.6 MHz and the sampling frequency SF is 14.4 MHz, same as those of Communications System A. The intermediate frequency and the sampling frequency SF cannot be arbitrarily changed.

A local frequency of 3.5 MHz is provided and tested signals S12 are input to the tested signal converter 13 to lower the frequency of the tested signals from 3.6 MHz to 100 kHz. Then the converted tested signals S13 are input to the low-pass filter 14 to remove unwanted frequency components. Moreover, The filtered tested signals S14 are input to the sampling frequency converter 15 for decimation process to lower the sampling frequency from 14.4 MHz to 400 kHz, so that the same test conditions as those for a conventional frequency spectrum analyzer are provided.

Thus the frequency spectrum resolution of Communications System B is 400 kHz÷8192=48.8≈50 Hz, equivalent to that of a conventional frequency spectrum analyzer.

As mentioned earlier, a frequency spectrum analyzer according to the invention sets system selector switches SW1, SW2 to perform frequency spectrum analysis via software by using proper tested signals. This reduces the apparatus size compared with a conventional frequency spectrum analyzer, shorten processing time compare with a frequency spectrum analyzer with apparatus size reduced, and reduces memory usage while maintaining the conventional frequency spectrum analysis performance.

What is claimed is:

1. A frequency spectrum method comprising the steps of:

converting a radio signal from one of two communication systems to a digital signal via an A/D converter;

inputting the digital signal to a Fourier transformer to obtain a frequency spectrum analysis result if the digital signal is derived from a first one of the two communication systems having a proper frequency band;

synthesizing the digital signal with a local frequency via a signal converter to output a synthesized digital signal if the digital signal is derived from the other of the two communication systems having an improper frequency band;

filtering the synthesized digital signal to output a filtered signal containing necessary signal components;

decimating the filtered signal to output a decimated signal; and performing a frequency spectrum analysis on the decimated signal via the Fourier transformer to obtain a frequency spectrum analysis result.

2. A frequency spectrum analyzer for performing a frequency spectrum analysis for two communication systems having different sampling frequencies from each other, the frequency spectrum analyzer comprising:

a signal converter for converting a test signal from one of the two communication systems to output a converted test signal;

a low-pass filter for filtering the converted test signal to output a filtered test signal;

a sampling frequency converter for decimating the filtered test signal to output a decimated signal having a sampling period longer than that of the filtered test signal;

two system selector switches for switching frequency spectrum analysis methods depending on which one of the two communication systems the test signal is received from; and a fast Fourier transformer for performing the Fourier transformation to output a frequency spectrum analysis result, wherein frequency spectrum is analyzed via software.

3. The frequency spectrum analyzer according to claim 2, wherein the signal converter performs frequency synthesis of the test signal and a local frequency to convert the test signal to the converted test signal having a proper frequency band.

4. The frequency spectrum analyzer according to claim 2, wherein the CA system selector switches make switching so that:

the test signal is input to the fast Fourier transformer if the signal is derived from a first one of the two communication systems and has a proper frequency band; and the test signal is converted by the signal converter, the low-pass filter and the sampling frequency converter, and the converted signal is input to the fast Fourier transformer, if the test signal is derived from the other of the two communication systems and has an improper frequency band.

5. A frequency spectrum analyzer for two communication systems having different frequencies from each other, the frequency spectrum analyzer comprising:

a single A/D converter for converting a test signal from one of the two communication systems to output a digital signal; and a frequency spectrum analysis section for performing frequency spectrum analysis on the digital signals, the frequency spectrum analysis section comprising:

a signal converter for converting a test signal to output a converted test signal;

a low-pass filter for filtering the converted test signal to output a filtered test signal;

a sampling frequency converter for decimating the filtered test signal to output a decimated signal having a sampling period longer than that of the filtered test signal;

two system selector switches for switching frequency spectrum analysis methods depending on which one of the communication systems the test signal is received from; and a fast Fourier transformer for performing the Fourier transformation to output a frequency spectrum analysis result, wherein frequency spectrum is analyzed using software.

6. The frequency spectrum analyzer according to claim 5, wherein the signal converter performs frequency synthesis of tested signals and a local frequency to convert the test signal to the converted test signal having a proper frequency band.

7. The frequency spectrum analyzer according to claim 5, wherein the system selector switches make switching so that:

the test signal is input to the fast Fourier transformer if the signal is derived from one of the two communication systems and has a proper frequency band; and the test signal is converted by the signal converter, the low-pass filter and the sampling frequency converter, and the converted signal is input to the fast Fourier transformer, if the test signal is derived from the other of the two communication systems and has an improper frequency band.

* * * * *